(12) United States Patent
Tsujino

(10) Patent No.: US 6,653,877 B2
(45) Date of Patent: Nov. 25, 2003

(54) SEMICONDUCTOR DEVICE CAPABLE OF INTERNALLY ADJUSTING DELAYED AMOUNT OF A CLOCK SIGNAL

(75) Inventor: Mitsunori Tsujino, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 14 days.

(21) Appl. No.: 09/741,803

(22) Filed: Dec. 22, 2000

(65) Prior Publication Data

US 2001/0054920 A1 Dec. 27, 2001

(30) Foreign Application Priority Data

Jun. 27, 2000 (JP) .................................... 2000-192517

(51) Int. Cl.⁷ .............................................. H03H 11/26
(52) U.S. Cl. ...................................... 327/161; 327/263
(58) Field of Search ................................ 327/161, 263, 327/264, 270, 276, 277, 278, 281, 291, 280, 293, 294, 295, 525, 149

(56) References Cited

U.S. PATENT DOCUMENTS

| | | | | |
|---|---|---|---|---|
| 5,122,679 A | * | 6/1992 | Ishii et al. | 327/147 |
| 5,185,540 A | * | 2/1993 | Boudry | 327/276 |
| 5,757,206 A | * | 5/1998 | Burton et al. | 326/39 |
| 5,926,046 A | * | 7/1999 | Uchida | 327/149 |
| 5,949,260 A | * | 9/1999 | Toda | 327/149 |
| 5,969,551 A | * | 10/1999 | Fujioka | 327/149 |
| 5,994,933 A | * | 11/1999 | Yamanaka et al. | 327/158 |
| 6,081,145 A | * | 6/2000 | Bandai et al. | 327/231 |
| 6,104,225 A | * | 8/2000 | Taguchi et al. | 327/291 |
| 6,239,631 B1 | * | 5/2001 | Fujioka et al. | 327/144 |
| 6,429,715 B1 | * | 8/2002 | Bapat et al. | 327/295 |

FOREIGN PATENT DOCUMENTS

| | | |
|---|---|---|
| JP | 4-363908 | 12/1992 |
| JP | 7-121261 | 5/1995 |
| JP | 8-274630 | 10/1996 |
| JP | 10-55668 | 2/1998 |
| JP | 10-117142 | 5/1998 |
| JP | 11-74783 | 3/1999 |

* cited by examiner

Primary Examiner—Timothy P. Callahan
Assistant Examiner—Linh Nguyen
(74) Attorney, Agent, or Firm—McDermott, Will & Emery

(57) ABSTRACT

A plurality of internal circuits each include a respective clock adjusting circuit that adjusts the phase of a clock signal given by a clock buffer. Even if a difference in delayed amount of the clock signal is generated by drawing clock interconnections, a different adjustment can be made for each internal circuit, whereby the operation of synchronized circuits respectively included in the plurality of internal circuits can be improved.

12 Claims, 12 Drawing Sheets

SEMICONDUCTOR DEVICE CAPABLE OF INTERNALLY ADJUSTING DELAYED AMOUNT OF A CLOCK SIGNAL

BACKGROUND OF THE INVENTION

1. Field of the Invention

The present invention relates to a semiconductor device, and more particularly to a semiconductor device including a circuit that operates in synchronization with a clock signal.

2. Description of the Background Art

A synchronous semiconductor device has a construction such that a control signal phase-synchronized with a clock signal given from the outside is supplied to a plurality of circuits, for example, output buffers. In such a synchronous semiconductor device, delayed amount of the control signal received by the plurality of circuits often differs in accordance with the arrangement of the circuits. Hitherto, various methods have been proposed so as to supply a phase-synchronized control signal to a plurality of circuits irrespective of the arrangement relationship between a circuit that generates a control signal and the circuits that operate by receiving the control signal.

Many of these are proposals of methods for optimizing the setting of interconnection length or interconnection width, or the way of drawing the interconnection in order to achieve synchronization. Actually, however, correction must often be made to achieve synchronization if synchronization of a signal has not been achieved because delayed amount of the signal in the inside of a sample product of a semiconductor device deviates from an expected value. It is not until a new mask corresponding to the correction is fabricated and a sample product of a semiconductor device is produced again for evaluation thereof that one can confirm whether or not the correction of the delayed amount of the signal has been made correctly or not.

The first factor that causes failure in synchronization of the control signal seems to be due to errors in estimation of load capacitance, interconnection capacitance, interconnection length, and others in a designing stage. The second factor seems to be a so-called production variation such as finishing variations in transistor capability, interconnection resistance, interconnection length, and interconnection width. If such a production variation occurs, one fails to obtain synchronization because the design parameters used in calculating the interconnection delay in the designing stage go wrong.

Further, there are actually a lot of cases in which the factors leading to failure in synchronization increase because an ideal interconnection cannot be drawn owing to the limitation of the arrangement of internal circuits in a chip layout. These shifts in the delay parasitic to the interconnection are called "skews", and should be compensated for. However, in the designing stage, it is difficult to read an appropriate adjustment value for correcting the delayed amount.

FIG. 14 is a view for describing a conventional technique of designing synchronized circuits. Conventionally, in a synchronized circuit such as shown in FIG. 14, there have been fundamentally two methods for distributing and supplying an output of a clock output circuit 302 to all of synchronized circuits 304, 306, and 308.

The first one is a method, such as disclosed in Japanese Patent Laying-Open No. 07-121261(1995), in which the delayed amount is adjusted for distributing and supplying the output of the clock output circuit 302 to all of the synchronized circuits. In this method, the position of metal interconnections 310 to 316, the position of interconnection branch points, and the interconnection length and interconnection width of each metal interconnection are changed on the basis of the propagation delay time calculated from the characteristics of an output element included in the clock output circuit 302, the load capacitance in the inside of the synchronized circuits 304 to 308, and the interconnection capacitance and interconnection resistance of the metal interconnections 310 to 316. By changing these parameters, the clock skew and the clock propagation delay time have been adjusted.

The second one is a method, such as disclosed in Japanese Patent Laying-Open No. 10-55668(1998), in which the lengths of real interconnections are made equal to each other by inserting a dummy interconnection or the like on a propagation passageway from the clock output circuit 302 to the plurality of synchronized circuits 304 to 308.

Known designing techniques such as described above are of importance in realizing synchronization; however they have been unable to solve the problems with certainty if production variation or estimation error occurs. In other words, in many of the cases in which such a problem occurs, it is not until the mask is corrected and a sample product of a semiconductor device is fabricated again for estimation thereof that one can find whether the problem has been solved or not.

SUMMARY OF THE INVENTION

Thus, an object of the present invention is to provide a semiconductor device capable of adjusting delayed amount of a control signal to each synchronized circuit in order to solve with certainty the problems that occur due to production variation or estimation error.

In summary, the present invention is directed to a semiconductor device having a plurality of internal circuits that operate in accordance with a control signal, wherein each of the internal circuits includes an adjusting circuit that receives the control signal to adjust a delay time for output, and a synchronized circuit that operates in accordance with the output of the adjusting circuit.

Therefore, a principal advantage of the present invention lies in that, since a clock adjusting circuit is provided for each synchronized circuit, the phase of the clock signal can be adjusted for each synchronized circuit block if the delay time caused by a clock signal line differs.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Figure 1:
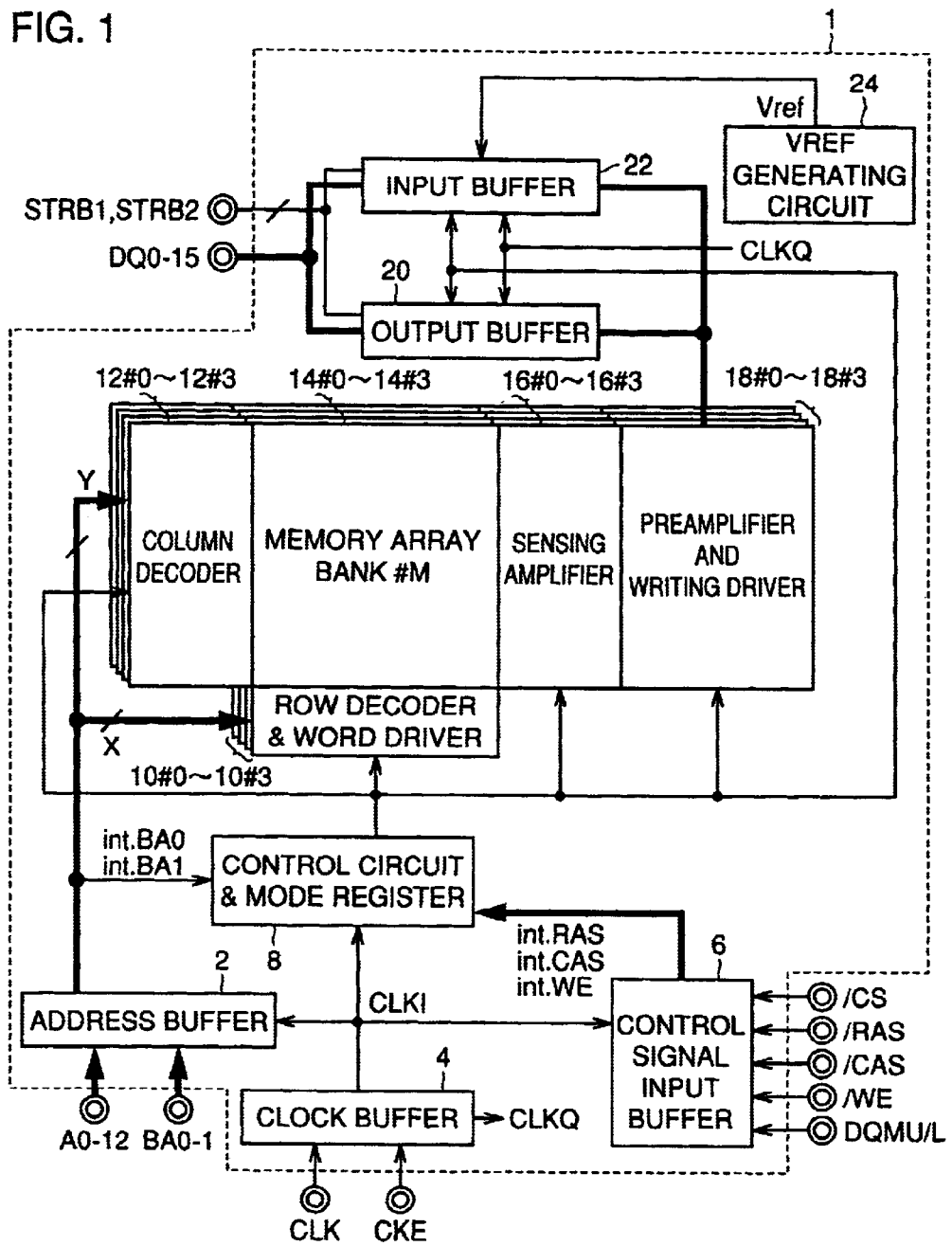
FIG. 1 is a block diagram illustrating a schematic construction of a synchronous semiconductor memory device 1 as an example of a synchronous semiconductor device.

Hereafter, embodiments of the present invention will be described in detail with reference to the attached drawings. Here, like reference numerals in the drawings denote like or corresponding parts.

[First Embodiment]

FIG. 1 is a block diagram illustrating a schematic construction of a synchronous semiconductor memory device 1 as an example of a synchronous semiconductor device.

Referring to FIG. 1, the synchronous semiconductor memory device 1 includes memory array banks 14#0 to 14#3 each having a plurality of memory cells that are arranged in a matrix configuration; an address buffer 2 that takes in address signals A0 to A12 and bank address signals BA0 to BA1, which are given from the outside, in synchronization with a clock signal CLKI and outputs an internal row address, an internal column address, and an internal bank address; a clock buffer 4 that receives a clock signal CLK and a clock enable signal CKE from the outside and outputs clock signals CLKI and CLKQ used in the inside; and a control signal input buffer 6 that takes in control signals /CS, /RAS, /CAS, /WE, and a mask signal DQMU/L, which are given from the outside, in synchronization with the clock signal CLKI.

The synchronous semiconductor memory device 1 further includes a control circuit that receives an internal address signal from the address buffer 2 and receives control signals int.RAS, int.CAS, int.WE synchronized with the clock signal from the control signal input buffer 6 to output a control signal to each block in synchronization with the clock signal CLKI, and a mode register that holds the operation mode recognized in the control circuit. In FIG. 1, the control circuit and the mode register are represented by one block 8.

The control circuit includes a bank address decoder that decodes internal bank address signals int.BA0, int.BA1, and a command decoder that receives and decodes the control signals int.RAS, int.CAS, int.WE.

The synchronous semiconductor memory device 1 further includes row decoders that are disposed respectively in correspondence with the memory array banks 14#0 to 14#3 and decode a row address signal X given from the address buffer 2, and word drivers for driving an address-designated row (word line) in the inside of the memory array banks 14#0 to 14#3 to a selected state in accordance with the output signals of these row decoders. In FIG. 1, the row decoders and the word drivers are collectively represented by blocks 10#0 to 10#3.

The synchronous semiconductor memory device 1 further includes column decoders 12#0 to 12#3 that decode internal column address signals Y given from the address buffer 2 to generate a column selection signal, and sensing amplifiers 16#0 to 16#3 that senses and amplifies data of the memory cells connected to the selected row of the memory array banks 14#0 to 14#3.

The synchronous semiconductor memory device 1 further includes an input buffer 22 that receives a write data from the outside to generate an internal write data, a write driver that amplifies the internal write data from the input buffer 22 and transmits the internal write data to the selected memory cell, a preamplifier that amplifies the data read from the selected memory cell, and an output buffer 20 that performs a buffer processing on the data from the preamplifier and outputs the data to the outside.

The preamplifier and the write driver are disposed respectively in correspondence with the memory array banks 14#0 to 14#3. In FIG. 1, the preamplifier and the write driver are represented by blocks 18#0 to 18#3 as one block.

The input buffer 22 takes in the data DQ0 to DQ15 given from the outside to the terminal in accordance with mutually complementary strobe signals STRB1, STRB2. These strobe signals STRB1 and STRB2 set up standards for data input timing of the synchronous semiconductor memory device 1. The synchronous semiconductor memory device 1 receives data in synchronization with these strobe signals STRB1 and STRB2 that are synchronously output with the data by another semiconductor device or the like. The synchronous semiconductor memory device 1 receives the strobe signals STRB1, STRB2, which are transmitted from the outside in parallel with the data and are given respectively to two terminals, as a standard for taking in the data signals.

The synchronous semiconductor memory device 1 further includes a Vref generating circuit 24 that generates a reference voltage Vref. The reference voltage Vref is input to the input buffer and constitutes a standard for a threshold value in taking in the data.

When the synchronous semiconductor memory device 1 outputs data to the outside, the output buffer 20 outputs the data DQ0 to DQ15 in synchronization with the clock signal CLKQ, and outputs to the outside the strobe signals STRB1, STRB2 for another semiconductor device to take in the data signal.

In such a synchronous semiconductor memory device 1, the clock signal CLK given from the outside is given by being converted by the clock buffer 4 into the clock signals CLKI, CLKQ that are used in the inside. For example, the clock signal CLKQ is given to the input buffer 22 and the output buffer 20; however, the clock delay time till the clock signal CLKQ is transmitted to the input buffer 22 is preferably equal to the clock delay time till the clock signal CLKQ is transmitted to the output buffer 20.

Figure 2:
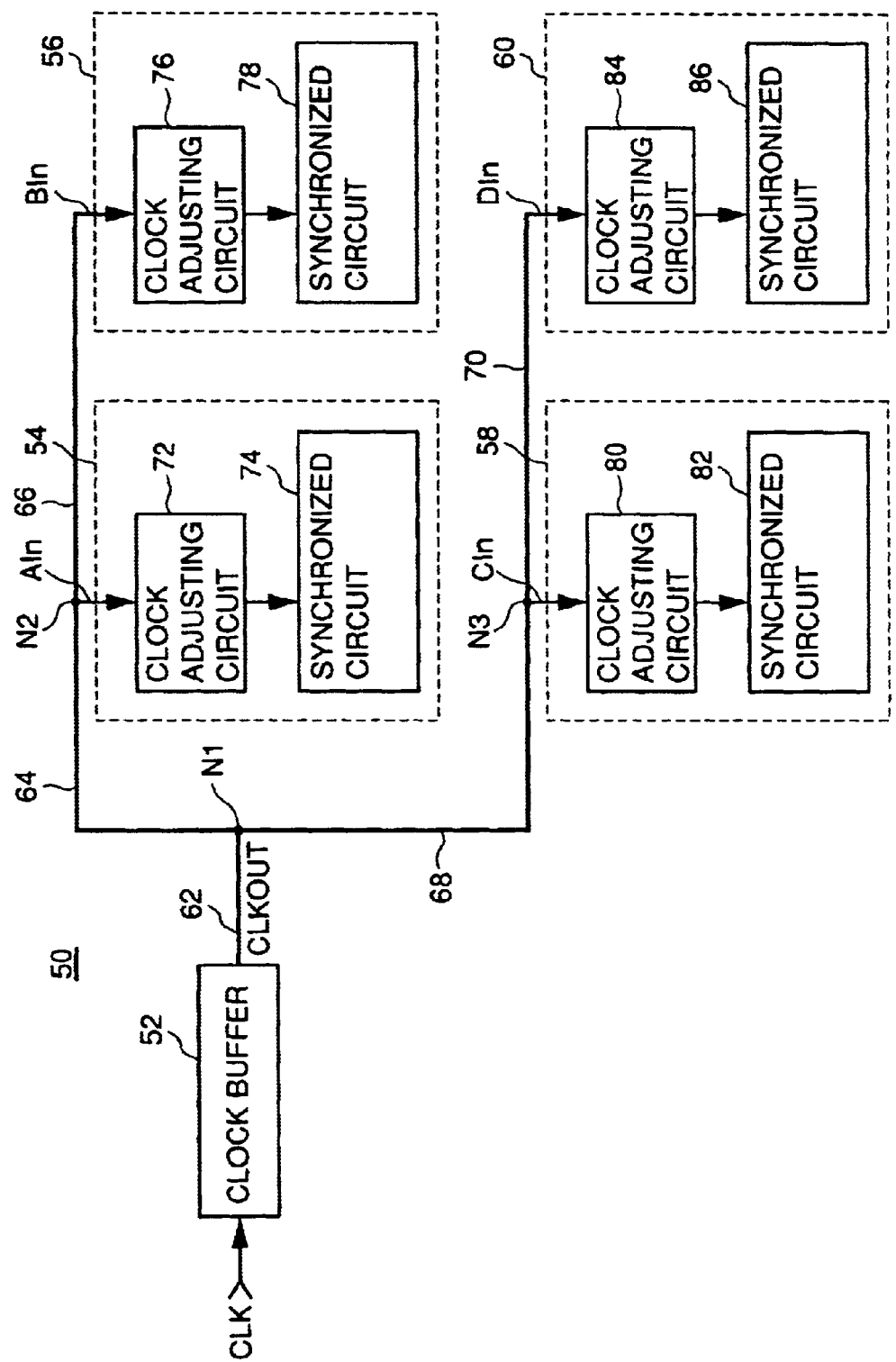
FIG. 2 is a view of a semiconductor device 50 for more generally describing the relationship between a clock buffer and internal circuits.

FIG. 2 is a view of a semiconductor device 50 for more generally describing the relationship between a clock buffer and internal circuits.

Referring to FIG. 2, the semiconductor device 50 includes a clock buffer 52 that receives a clock signal CLK given from the outside, a clock interconnection that receives a clock signal CLKOUT output from the clock buffer 52, and internal circuits 54 to 60 that respectively receive the clock signal CLKOUT from the clock interconnection. The clock interconnection includes parts that are represented by clock interconnections 62 to 70.

The clock interconnection 62 is connected between the output of the clock buffer 52 and the node N1. The clock interconnection 64 is connected between the node N1 and the node N2. The clock interconnection 66 is connected between the node N2 and the input of the internal circuit 56. The clock interconnection 68 is connected between the node N1 and the node N3. The clock interconnection 70 is connected between the node N3 and the input of the internal circuit 60.

The internal circuit 54 includes a clock adjusting circuit 72 that receives from the node N2 a clock signal AIn delayed by the clock interconnection for adjustment of the phase, and a synchronized circuit 74 that receives the adjusted clock signal from the clock adjusting circuit 72 and operates in synchronization with the clock signal.

The internal circuit 56 includes a clock adjusting circuit 76 that receives from the clock interconnection 66 a clock signal BIn delayed by the clock interconnection for adjustment of the phase, and a synchronized circuit 78 that receives the adjusted clock signal from the clock adjusting circuit 76 and operates in synchronization with the clock signal.

The internal circuit 58 includes a clock adjusting circuit 80 that receives from the node N3 a clock signal CIn delayed by the clock interconnection for adjustment of the phase, and a synchronized circuit 82 that receives the adjusted clock signal from the clock adjusting circuit 80 and operates in synchronization with the clock signal.

The internal circuit 60 includes a clock adjusting circuit 84 that receives from the clock interconnection 70 a clock signal DIn delayed by the clock interconnection for adjustment of the phase, and a synchronized circuit 86 that receives the adjusted clock signal from the clock adjusting circuit 84 and operates in synchronization with the clock signal.

According to such an arrangement relationship, the internal circuit 54 for example receives the clock signal via the clock interconnections 62, 64. Since the internal circuit 56 is located farther away from the clock buffer 52 than the internal circuit 54, the internal circuit 56 receives the clock signal further via the clock interconnection 66 in addition to the clock interconnections 62, 64. Therefore, in such a case, it is difficult to construct an equal clock interconnection length from the clock buffer to the internal circuits. If an equal interconnection length is forcibly constructed, the clock interconnection for supply to the internal circuit 54, for example, will be long, so that it is not preferable in view of performing a tip layout with a good area efficiency.

Figure 3:
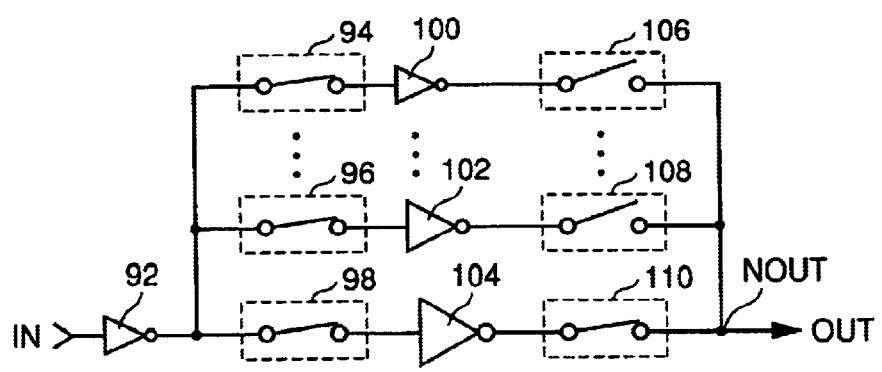
FIG. 3 is a circuit diagram illustrating the construction of a clock adjusting circuit 72 in FIG. 2.

FIG. 3 is a circuit diagram showing a construction of the clock adjusting circuit 72 in FIG. 2. Referring to FIG. 3, the clock adjusting circuit 72 includes an inverter 92 that receives and inverts an input signal IN, switch circuits 94 to 98 whose one end is connected to the output of the inverter 92, inverters 100 to 104 whose input is respectively connected to the other end of the switch circuits 94 to 98, and switch circuits 106 to 110 whose one end is respectively connected to the output of the inverters 100 to 104. The other end of each of the switch circuits 106 to 110 is connected to the output node NOUT, and an output signal OUT is output from the output node NOUT. The inverters 100 to 104 are respectively adjusted to have mutually different delay time.

The switch circuits 94 to 98 are set in a conduction state as an initial state. The switch circuits 106, 108 are set in a non-conduction state as an initial state. The switch circuits 110 is set in a conduction state as an initial state. Therefore, in the initial state, the input signal IN is transmitted to the output node NOUT via the inverter 92, the switch circuit 98, the inverter 104, and the switch circuit 110.

If all the switch circuits on the input side are closed, it is advantageous because the load capacitance of the inverter 92 is invariable even if the switches on the output side are switched. Further, the passageway that is used can be separated completely from the passageways that are not used if, among the switch circuits on the input side, only the switch circuit corresponding to the passageway that is used is closed to leave the other switch circuits in an open state. For example, it is advantageous from the view point of electric current consumption and noises because unnecessary operations are not performed in the inverters 100 to 104.

Figure 4:
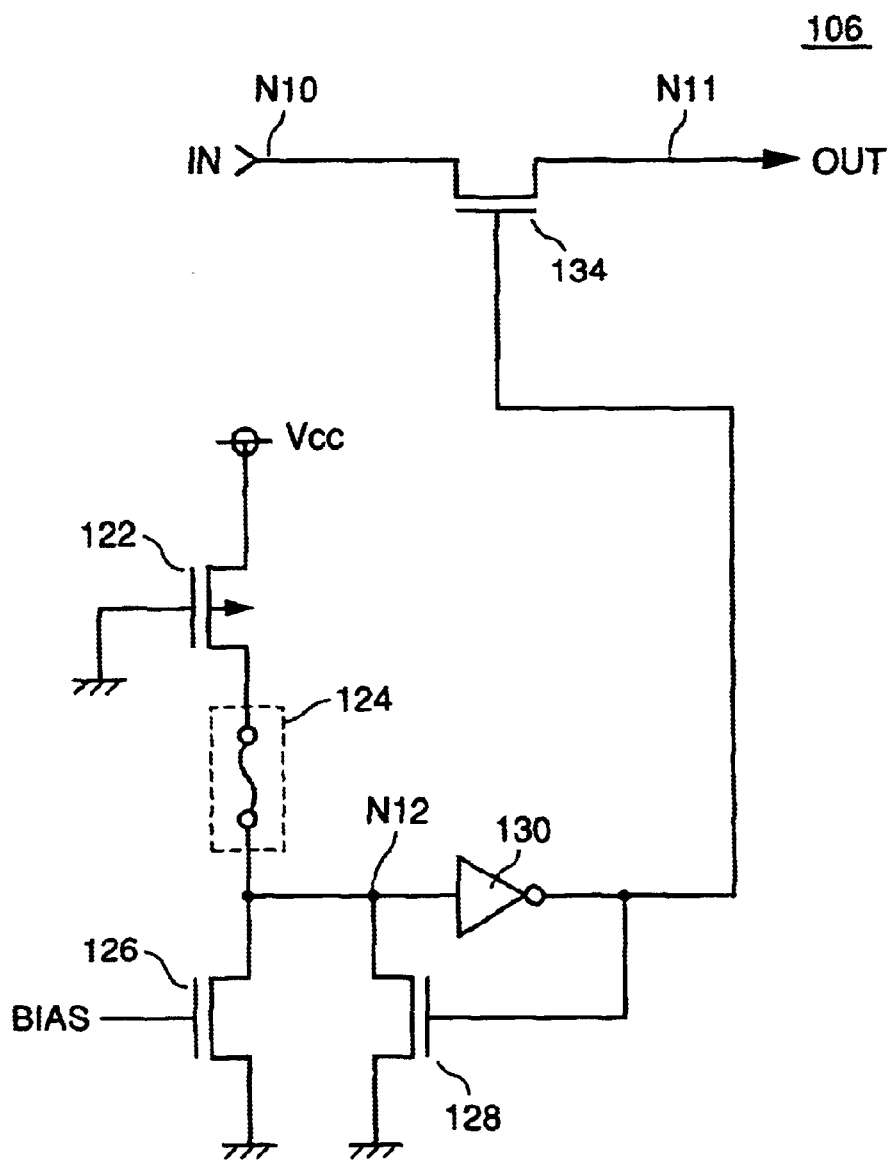
FIG. 4 is a circuit diagram illustrating a construction example of a switch circuit 106 in FIG. 3.

FIG. 4 is a circuit diagram illustrating a construction example of the switch circuit 106 in FIG. 3. Referring to FIG. 4, the switch circuit 106 includes a P-channel MOS transistor 122 whose source is coupled to the power supply voltage Vcc and whose gate is connected to the ground node, a fuse element 124 which is connected between the drain of the P-channel MOS transistor 122 and the node N12, an N-channel MOS transistor 126 which is connected between the node N12 and the ground node and whose gate receives a bias voltage BIAS, an inverter 130 whose input is connected to the node N12, an N-channel MOS transistor 128 whose gate receives an output of the inverter 130 and which is connected between the node N12 and the ground node, and an N-channel MOS transistor 134 which is connected between the node N10 and the node N11 and whose gate receives an output of the inverter 130. The node N10 is a node that receives an input signal IN of this switch circuit 106, and the node N11 is a node that outputs an output signal OUT of this switch circuit 106.

In the initial state in which the fuse 124 is in a conduction state, the node N12 is at H-level and the output of the inverter 130 is at L-level, so that the N-channel MOS transistor 134 is in a non-conduction state. Therefore, the switch circuit 106 is in an off-state in the initial state.

When the fuse element 124 is cut off by a laser beam or the like, the voltage of the node N12 is at L-level by the N-channel MOS transistor 126 which is given a gate voltage so as to allow a minute electric current to flow, whereby the output of the inverter 130 is at H-level. In accordance therewith, the N-channel MOS transistor 134 is in a conduction state.

Here, the switch circuit 108 illustrated in FIG. 3 has a construction similar to that of the switch circuit 106, so that an explanation thereof will not be repeated.

Figure 5:
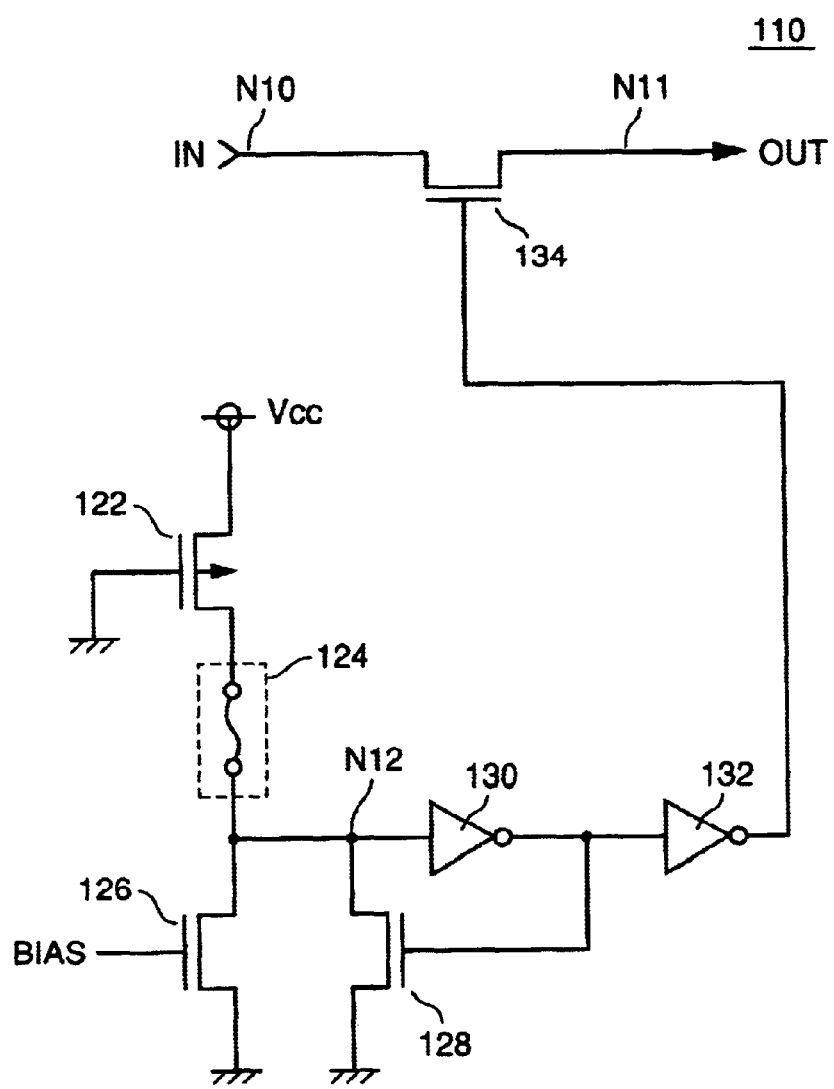
FIG. 5 is a circuit diagram illustrating a construction example of a switch circuit 110 in FIG. 3.

FIG. 5 is a circuit diagram illustrating a construction example of the switch circuit 110 in FIG. 3. Referring to FIG. 5, the switch circuit 110 further includes, in the construction of the switch circuit 106 illustrated in FIG. 4, an inverter 132 that receives and inverts an output of the inverter 130 and gives the inverted output to the gate of the N-channel MOS transistor 134. The other constituent elements are the same as those of the switch circuit 106 illustrated in FIG. 4, so that an explanation thereof is will not be repeated.

In the switch circuit 110, in the initial state in which the fuse 124 is not cut off, the voltage of the node N12 is at H-level. Therefore, the output of the inverter 130 is at L-level, so that the output of the inverter 132 is at H-level. In accordance therewith, the N-channel MOS transistor 134 is in a conduction state.

On the other hand, when the fuse element 124 is cut off, the node N12 is at L-level and the output of the inverter 132 is at L-level, so that the N-channel MOS transistor 134 is in a non-conduction state.

Here, the switch circuits 94, 96, 98 in FIG. 3 have a construction similar to that of the switch circuit 110, so that an explanation thereof will not be repeated.

Figure 6:
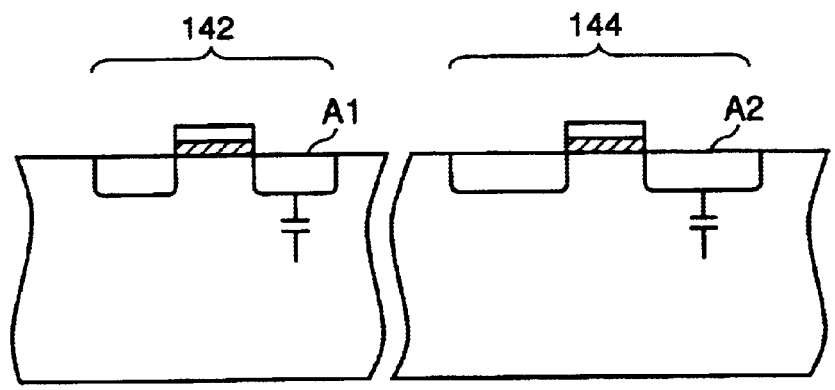
FIG. 6 is a view for describing adjustment of delayed amounts in inverters 100 to 104 shown in FIG. 3.

FIG. 6 is a view for describing adjustment of delayed amounts in the inverters 100 to 104 shown in FIG. 3.

Referring to FIG. 6, as an example of realizing inverters each having a different delay time, it may be considered that a junction capacitance is varied by changing the source/drain area of the transistors used in the inverters. For example, if the drain area A2 of the transistor 144 is increased as compared with the drain area A1 of the transistor 142, the parasitic capacitance added to the output of the transistor 144 increases. Therefore, by constructing the inverters with the use of these transistors, the output delay time of the inverters can be changed in a subtle manner.

For example, a case often occurs in which the delay time is deviated by several ten ps (picoseconds) from the estimate thereof. In such a case, the adjustment is difficult by a method of changing the number of stages in the inverter, i.e. by switching the number of inverter stages in the signal propagation passageway with a unit of a two-stage inverter. This is because the propagation delay time of the two-stage inverter is currently about several hundred ps.

In such a case, it is sufficient if the inverters 100 to 104 are allowed to have mutually different fan-outs (F.O.). The fan-out refers to the number of next-stage circuits that one circuit can drive. If the fan-out is increased, the rise time of the voltage of the node NOUT in FIG. 3 to which the load capacitance of the next-stage circuit is connected can be shortened. Therefore, the delay time can be adjusted using the fan-out as a parameter.

Figure 7:
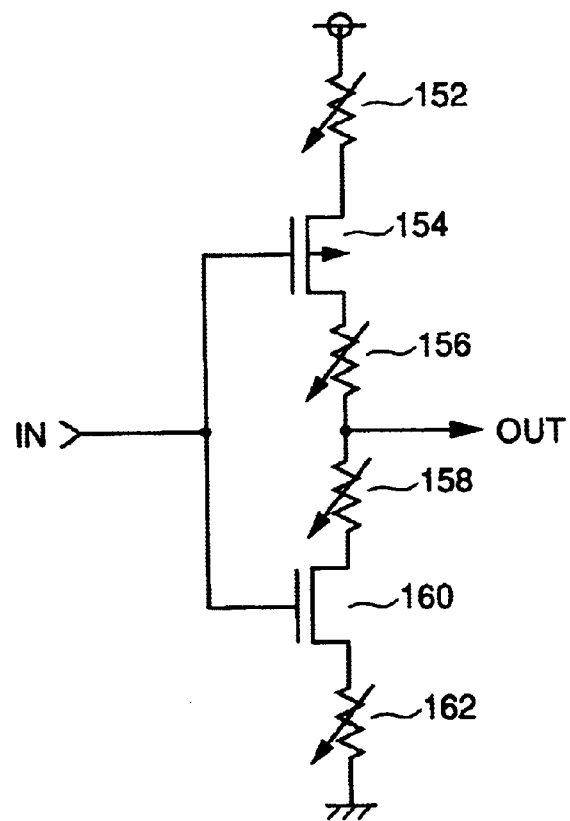
FIG. 7 is a circuit diagram illustrating another example of providing difference in delay time.

FIG. 7 is a circuit diagram illustrating another example of providing difference in delay time.

Referring to FIG. 7, an inverter includes a resistor 152, a P-channel MOS transistor 154, resistors 156, 158, an N-channel MOS transistor 160, and a resistor 162, which are connected in series between the power supply node and the ground node. An input signal IN is given to the gate of the P-channel MOS transistor 154 and the gate of the N-channel MOS transistor 160, and an output signal OUT is output from the ground node of the resistors 156, 158. The delayed amount can be allowed to have a subtle difference by changing the resistance values of the resistors 152, 156, 158, 162 in each inverter. For example, the resistance value can be allowed to have a difference by changing the number of contact holes disposed between the diffusion layer at the source part of the P-channel MOS transistor 154 and the aluminum interconnection layer which is a power supply node.

Figure 8:
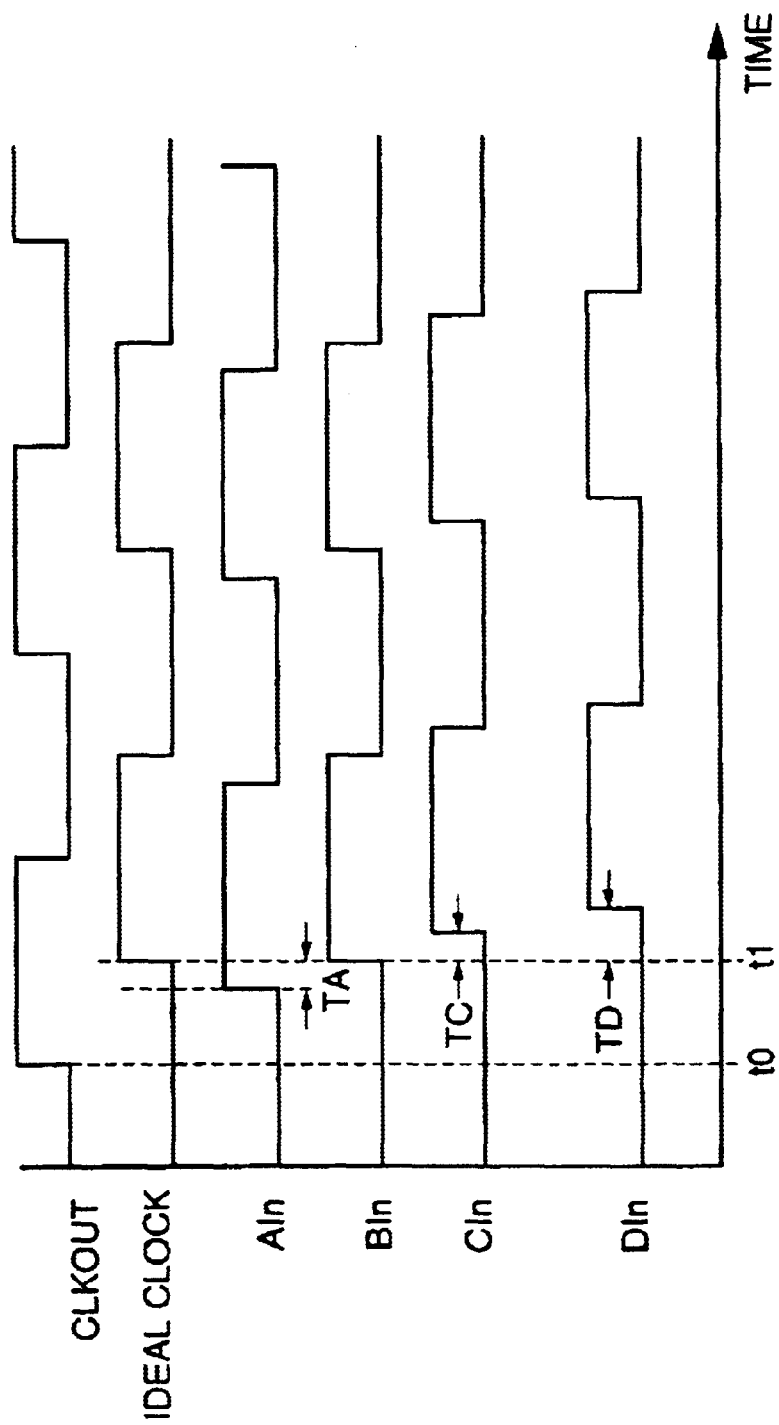
FIG. 8 is a waveform diagram for describing adjustment of clock signals.

FIG. 8 is a waveform diagram for describing the adjustment of the clock signal.

Referring to FIGS. 2 and 8, the clock signal CLKOUT output by the clock buffer 52 rises from the L-level to the H-level at the time t0. The ideal clock signal to be given to each of the synchronized circuits 74, 78, 82, 86 preferably rises at the time t1 which is uniformly delayed by passage of the clock signal CLKOUT through the propagation passageways from the clock buffer to each synchronized circuit.

However, the clock signal actually given to each synchronized circuit is not the ideal clock signal because the propagation passageways are different. For example, the clock signal AIn given from the node N2 to the clock adjusting circuit 72 before adjustment rises earlier by TA than the time t1. The clock signal BIn given to the clock adjusting circuit 76 has a delay time approximately the same as the ideal clock without adjustment. The clock signal CIn given to the clock adjusting circuit 80 rises later by TC than the ideal clock. The clock signal DIn given to the clock adjusting circuit 84 rises later by TD than the ideal clock.

If the clock signal given to each synchronized circuit is in such a state in the initial state, an adjustment is made to delay the clock signal AIn by TA in the clock adjusting circuit 72, and an adjustment is made to advance the clock signal CIn by TC in the clock adjusting circuit 80. Further, an adjustment is made to advance the clock signal DIn by TD in the clock adjusting circuit 84.

Thus, a clock adjusting circuit is provided in each synchronized circuit, and the phase of the clock signal can be adjusted for each synchronized circuit block. Therefore, the delayed amount of the clock can be adjusted after the passageway of the clock interconnection to each synchronized circuit block is optimized in view of area efficiency in the process of designing the tip layout.

Here, the description has been given on the case of adjusting the delayed amount by showing an example in which the control signal is a clock signal; however, it can be applied to a control signal other than a clock signal if it is a control signal used commonly in each synchronized circuit.

Further, the description has been given on the case of the clock adjusting circuit in which the switch circuits are switched with the use of the fuse element; however, they may be switched by a method other than the fuse element. For example, since the relative difference in the delayed amount is grasped by simulation or the like in the inverters included in the clock adjusting circuit and having different delayed amounts, one can find which inverter should be used without actually switching the switch circuits particularly using the fuse if an internal waveform can be observed. Therefore, even if an operation error occurs by clock skew or the like at the time of fabricating the first sample product, a correct operation can be realized at the time of fabricating the next sample product by changing the mask of the interconnection layer.

Further, the description has been given on the case in which one of the inverters is selectively used; however, two inverters may be used in parallel connection. For example, if the load of the clock interconnection of the synchronized circuit is large, the delay of the clock signal can be reduced by using a plurality of inverters in parallel. By switching the switch circuit 108 of FIG. 3 to the conduction state, the node NOUT is driven by the inverters 102, 104, so that the operation can be improved.

[Second Embodiment]

Figure 9:
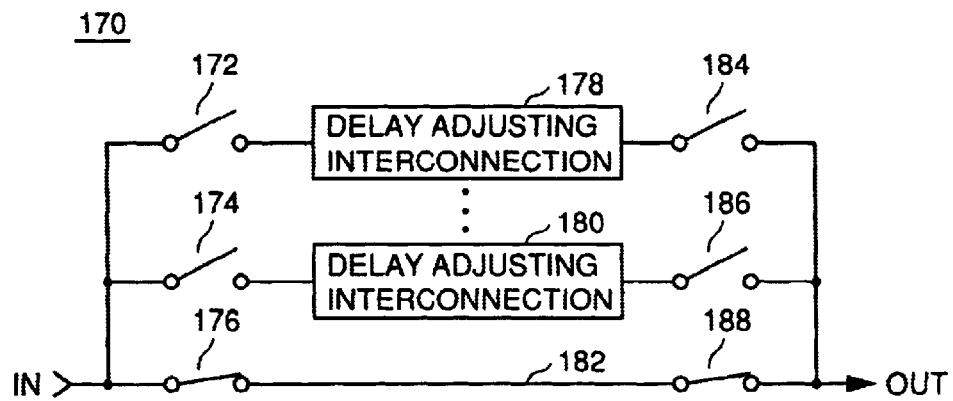
FIG. 9 is a block diagram illustrating the construction of a clock adjusting circuit 170 in the second embodiment.

FIG. 9 is a block diagram illustrating the construction of a clock adjusting circuit 170 in the second embodiment.

In the first embodiment, the clock adjusting circuit 72 such as shown in FIG. 3 is provided in correspondence with each of the plurality of synchronized circuits. In the second embodiment, a clock adjusting circuit 170 is provided in correspondence with each of the plurality of synchronized circuits.

Referring to FIG. 9, the clock adjusting circuit 170 includes switch circuits 172 to 176 whose one end is given an input signal IN, delay adjusting interconnections 178, 180 and standard interconnection 182 whose one end is respectively connected to the other end of the switch circuits 172 to 176, and switch circuits 184, 186, 188 whose one end is respectively connected to the other end of the delay adjusting interconnections 178, 180 and standard interconnection 182. An output signal OUT of the clock adjusting circuit 170 is output from the other end of the switch circuits 184, 186, 188.

The switch circuits 176, 188 are set in a conduction state as an initial state, and the switch circuits 172, 174, 184, 186 are set in a non-conduction state as an initial state.

The construction of the switch circuits 172, 174, 184, 186 is similar to that of the switch circuit 106 shown in FIG. 4, so that an explanation thereof will not be repeated. The construction of the switch circuits 176, 188 is similar to that of the switch circuit 110 shown in FIG. 5, so that an explanation thereof will not be repeated.

Here, the delay adjusting interconnections 178, 180 are interconnections having mutually different propagation delay time, and an adjustment of the delay time of a signal can be made by switching these delay adjusting interconnections 178, 180 with the standard interconnection 182 to change the passageways through which the signal passes. In FIG. 9, an example is shown in which one of the three passageways is selected; however, a larger number of delay adjusting interconnections may be provided to enable selection of the passageway for the signal to pass through among a larger number of passageways, thereby to increase the number of choices of delay time that can be adjusted.

Figure 10:
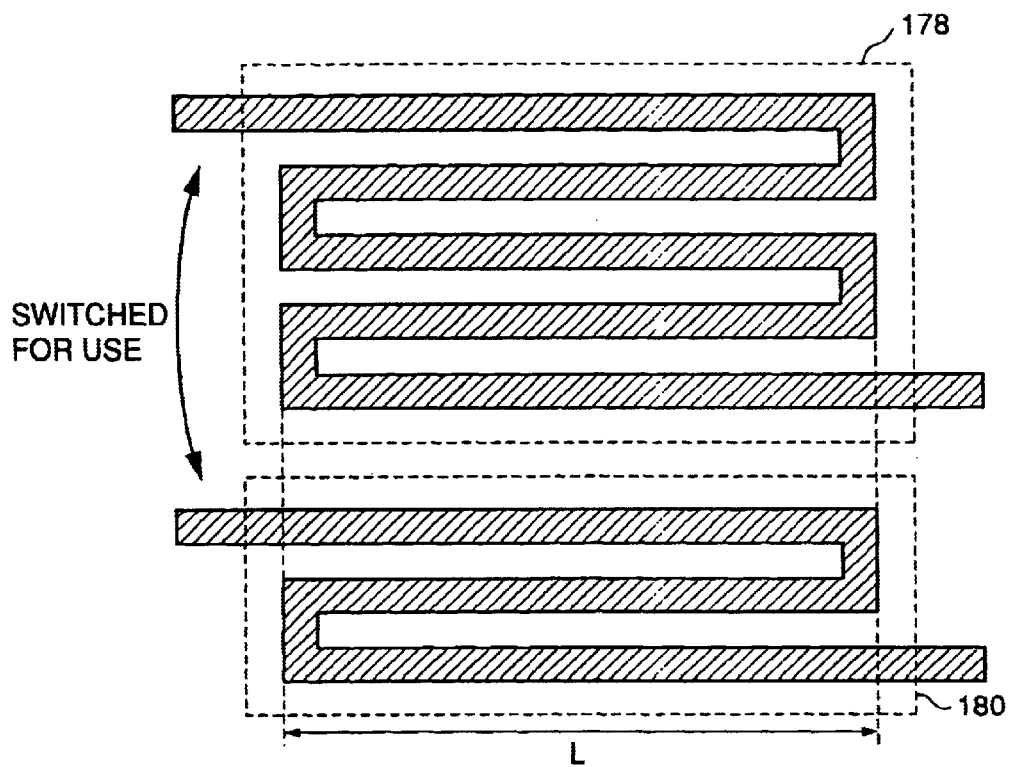
FIG. 10 is a view for describing the configuration of delay adjusting interconnections 178, 180 in FIG. 9.

FIG. 10 is a view for describing the configuration of delay adjusting interconnections 178, 180 in FIG. 9.

Referring to FIG. 10, the delay adjusting interconnections 178, 180 are constructed with the same interconnection width and with the same material, for example, aluminum, as the standard interconnection 182 in FIG. 9. Only the length of the delay adjusting interconnections 178, 180 is changed while maintaining the width and the material to be the same. For example, assuming the standard interconnection 182 to have a length L, the delay adjusting interconnection 180 is allowed to have a length of 3 L, and the delay adjusting interconnection 178 is allowed to have a length of 5 L. By changing only the length, adjustment of the delay variation caused by the production variation is facilitated. For example, it has an advantage that this variation need not be taken into account so much regarding the relative difference in delay time even if the variation occurs in the finish of the interconnection width and in the resistance value. A clock adjusting circuit that uses such a delay adjusting interconnection has a high adjustment precision though it uses a large layout area.

[Third Embodiment]

Figure 11:
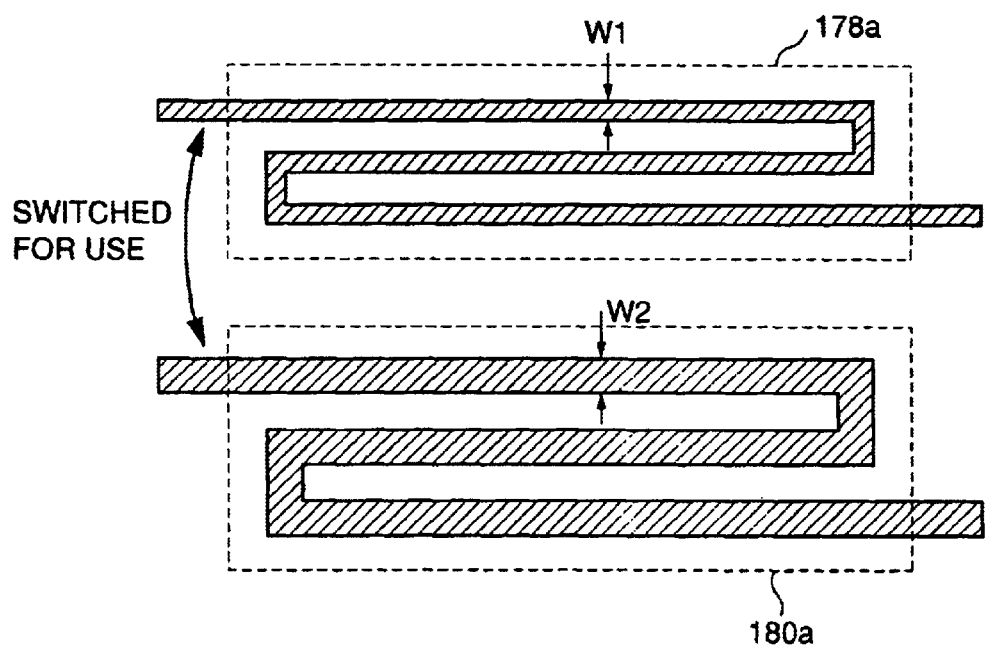
FIG. 11 is a view for describing the configuration of delay adjusting interconnections 178a, 180a used in the third embodiment.

FIG. 11 is a view for describing the configuration of delay adjusting interconnections 178a, 180a used in the third embodiment.

Referring to FIG. 11, the clock adjusting circuit in the third embodiment includes delay adjusting interconnections 178a, 180a instead of the delay adjusting interconnections 178, 180 in the construction of the clock adjusting circuit 170 shown in FIG. 9.

The delay adjusting interconnections 178a, 180a are set to have the same length, and the interconnection resistance is changed by adjusting the interconnection width. For example, the width W1 of the delay adjusting interconnection 178a is set to be half of the width W2 of the delay adjusting interconnection 180a.

In the case of FIG. 10, the length of the delay adjusting interconnection 180 is 3 L and, in order to realize a resistance value of about five thirds of the resistance value of the delay adjusting interconnection 180, the length of the delay adjusting interconnection 178 is 5 L. Therefore, the delay adjusting interconnection 178 needs approximately twice the area of the delay adjusting interconnection 180. However, in the case of the delay adjusting interconnection 178a shown in FIG. 11, the resistance value can be doubled with approximately the same area as the delay adjusting interconnection 180a by reducing the width to that extent.

[Fourth Embodiment]

FIG. 11 is a view for describing the configuration of delay adjusting interconnections 178b, 180b.

Figure 12:
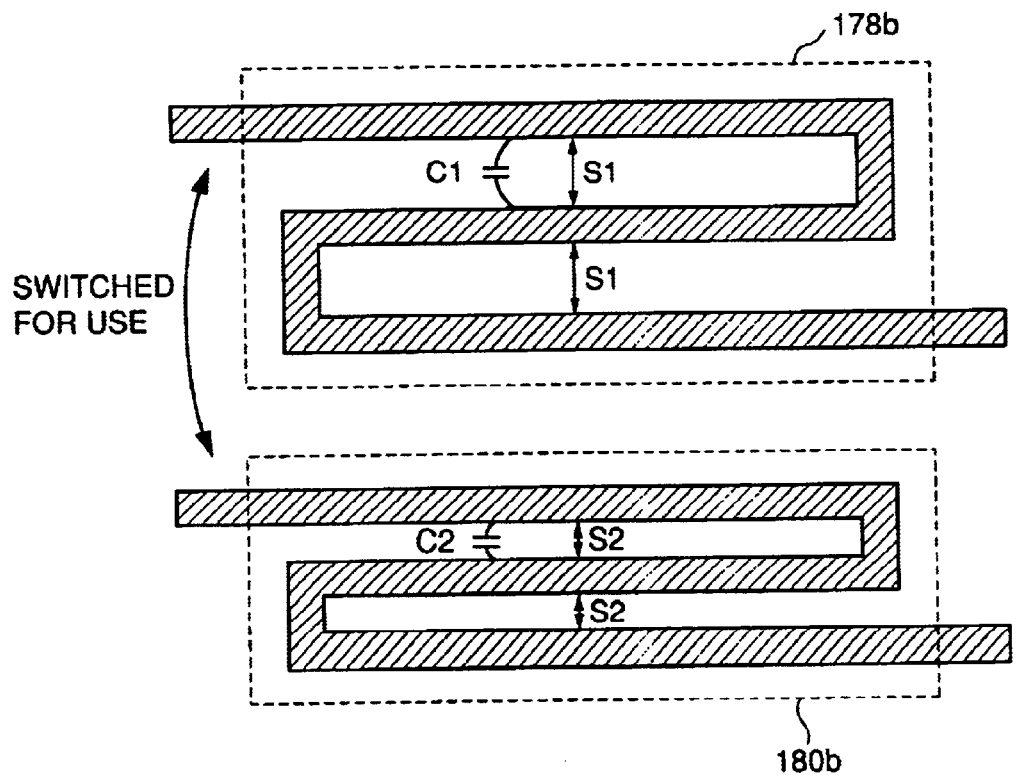
FIG. 12 is a view for describing the configuration of delay adjusting interconnections 178b, 180b.

Referring to FIG. 12, the clock adjusting circuit in the fourth embodiment includes delay adjusting interconnections 178b, 180b instead of the delay adjusting interconnections 178, 180 in the construction of the clock adjusting circuit 170 shown in FIG. 9.

The delay adjusting interconnections 178b, 180b are set to have approximately the same interconnection width and the same interconnection length. However, though the delay adjusting interconnection 180b has an interval S2 to an adjacent interconnection, the delay adjusting interconnection 178b is set to have a wider interval S1 to an adjacent interconnection. By such setting, the capacitance C1 parasitic between the interconnections can be made smaller than the capacitance C2 parasitic between the interconnections, whereby the delay time generated in propagating a signal can be changed. The delay time can be finely adjusted by switching between the delay adjusting interconnections 178b, 180b for use.

[Fifth Embodiment]

Figure 13:
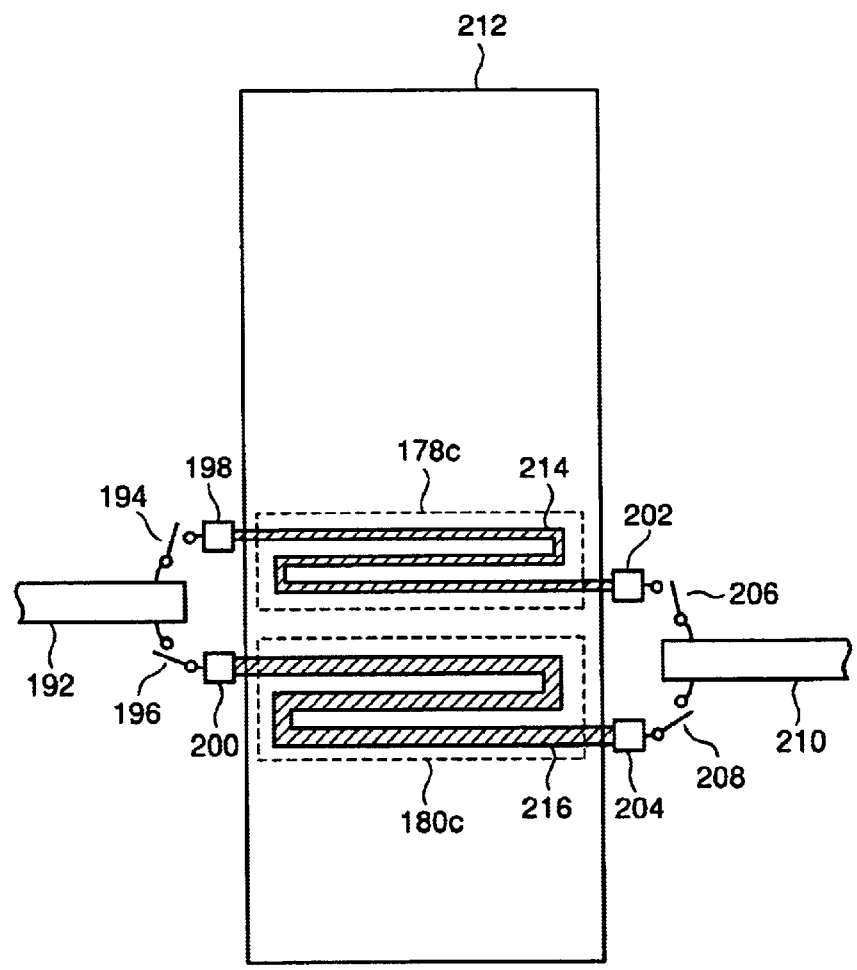
FIG. 13 is a view for describing the configuration of a clock adjusting circuit in the fifth embodiment.
Figure 14:
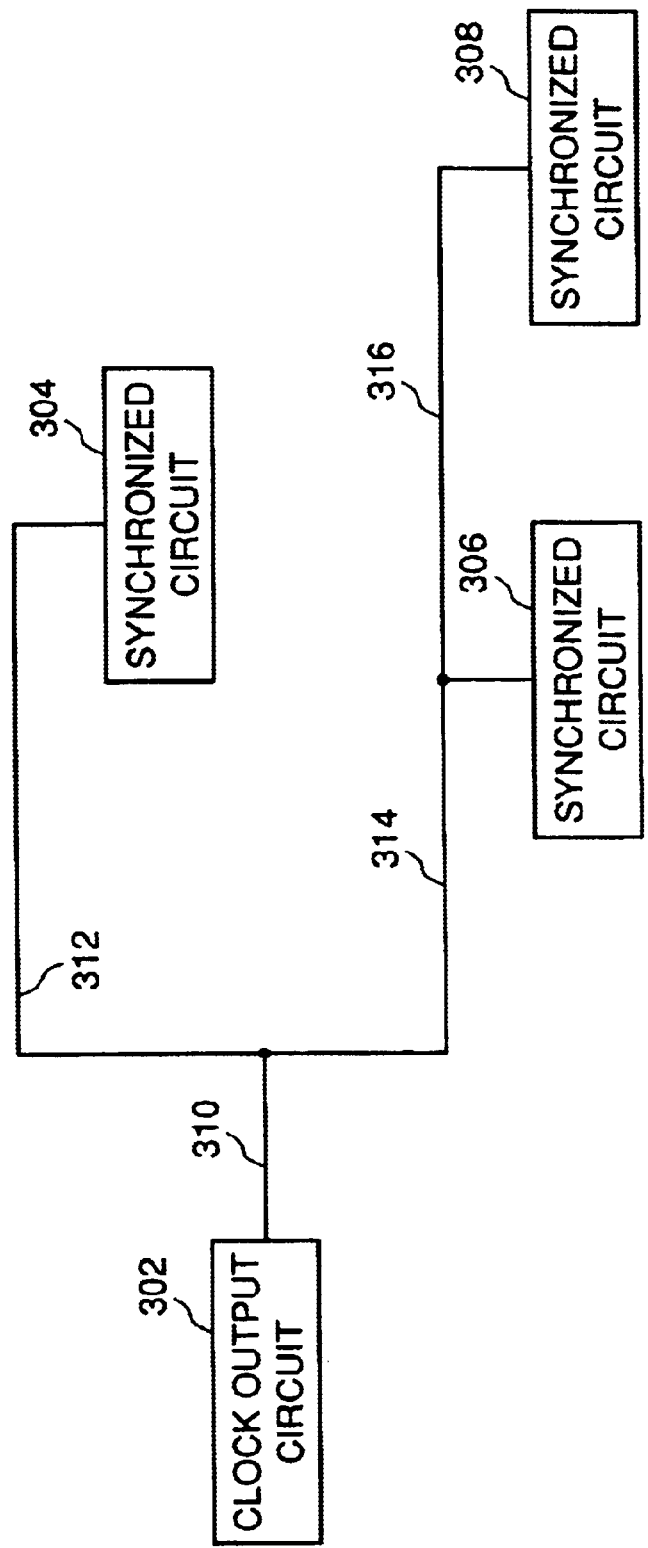
FIG. 14 is a view for describing a conventional technique of designing synchronized circuits.

FIG. 13 is a view for describing the configuration of a clock adjusting circuit in the fifth embodiment.

Referring to FIG. 13, the delay adjusting interconnections 178c, 180c are switched for use in the clock adjusting circuit of the fifth embodiment. Interconnection layers different from those generally used for signal propagation or electric power supply are used for the interconnections 214, 216 included in the delay adjusting interconnections 178c, 180c. For example, in a semiconductor memory device, the interconnection layer for propagating a general signal is often made of aluminum (Al). Materials other than aluminum, such as polysilicon or tungsten (W), are present for use in the interconnection layer. Aluminum has the smallest sheet resistance, and the sheet resistance increases in the order from aluminum, tungsten to polysilicon. Therefore, the resistance value can be varied by changing the material, even if the configuration thereof is not changed so much, thereby providing a difference in delay time.

The clock signal transmitted by the aluminum interconnection 192 is transmitted to the clock interconnection 210 connected to the inside of the synchronized circuit via the delay adjusting interconnection 178c if the switch circuits 194, 206 are set in a conduction state. On the other hand, if the switch circuits 196, 208 are set in a conduction state, the clock signal is transmitted via the delay adjusting interconnection 180c.

Typically, a power supply interconnection 212 having a large area for supplying electric power is disposed from the power supply circuit towards the synchronized circuit block. The power supply interconnection 212 is typically made of aluminum. By using tungsten or polysilicon in the delay adjusting interconnection, the delay adjusting interconnection can be positioned as a layer below the power supply interconnection, thereby effectively utilizing the area. Here, in this case also, the switch part is preferably an aluminum interconnection layer formed in a later step than tungsten or polysilicon in a wafer fabricating process, so as to facilitate switching of connection. Therefore, a connecting part made of aluminum is disposed at both ends of the delay adjusting interconnection, such as connecting parts 198, 200, 202, 204.

As described above, an effective utilization of area is made possible by providing delay adjusting interconnections with the use of a plurality of interconnection layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a clock buffer circuit that receives an external clock signal from outside and outputs an internal clock signal;
a clock interconnection that transmits an output of said clock buffer circuit; and first and second internal circuits that operate in accordance with said internal clock signal transmitted by said clock interconnection, each of said first and second internal circuits including:
an adjusting circuit configured to delay said internal clock signal, and
a synchronized circuit that operates in accordance with the output of said adjusting circuit, wherein
said adjusting circuit is configured further to output an adjusted clock signal to reduce a time difference between a first propagation time and a second propagation time to less than a time difference between a third propagation time and a fourth propagation time,
said first propagation time corresponds to a time period between a time point when said internal clock signal is output from said clock buffer circuit and a time point when said adjusted clock is output from said adjusting circuit of said first internal circuit,
said second propagation time corresponds to a time period between a time point when said internal clock signal is output from said clock buffer circuit and a time point when said adjusted clock is output from said adjusting circuit of said second internal circuit,
said third propagation time corresponds to a time period between a time point when said internal clock signal is output from said clock buffer circuit and a time point when said adjusting circuit of said first internal circuit receives said internal clock signal, and
said fourth propagation time corresponds to a time period between a time point when said internal clock signal is output from said clock buffer circuit and a time point when said adjusting circuit of said second internal circuit receives said internal clock signal.

2. The semiconductor device according to claim 1, wherein said clock interconnection comprises:
a first part that connects between an output part of said clock buffer circuit and said first internal circuit, and
a second part that connects between said first part and said second internal circuit.

3. A semiconductor device comprising:
a clock buffer circuit that receives an external clock signal from outside and outputs an internal clock signal;
a clock interconnection that transmits an output of said clock buffer circuit; and
a plurality of internal circuits that operate in accordance with said internal clock signal transmitted by said clock interconnection, each of said internal circuits including:
an adjusting circuit that outputs an adjusted internal clock by delaying said internal clock signal for a time period according to a delay time from said clock buffer circuit to a corresponding one of said plurality of internal circuits, and
a synchronized circuit that operates in accordance with the output of said adjusting circuit, wherein
said adjusting circuit comprises:
an input node that receives said internal clock signal,
an output node that outputs a signal to said synchronized circuit, and
a plurality of passageways that pass from said input node to said output node,
each of said passageways has an inverter and a first switch circuit that transmits an output of said inverter to said output node in accordance with a first set value, wherein said first switch circuit includes a fuse element capable of setting, in a non-volatile manner, a conduction state that corresponds to said first set value.

4. A semiconductor device comprising a plurality of internal circuits that operate in accordance with a control signal, each of said internal circuits including
an adjusting circuit that receives said control signal to adjust a delay time for output, wherein said control signal is an internal clock signal;
a synchronized circuit that operates in synchronization with the output of said adjusting circuit;
a clock buffer circuit that receives an external clock signal from outside and outputs said internal clock signal;
a clock interconnection that transmits an output of said clock buffer circuit to said plurality of internal circuits; and
said synchronized circuit operates in synchronization with the output of the adjusting circuit;
wherein said adjusting circuit includes:
an input node that receives said control signal,
an output node that outputs a signal to said synchronized circuit, and
a plurality of passageways that pass from said input node to said output node; and
each of said passageways has an inverter and a first switch circuit that transmits an output of said inverter to said output node in accordance with a first set value,
wherein said inverters included in first and second passageways of said plurality of passageways are first and second inverters, respectively, and said first and second inverters each have a different propagation delay time.

5. A semiconductor device comprising a plurality of internal circuits that operate in accordance with a control signal, each of said internal circuits including
an adjusting circuit that receives said control signal to adjust a delay time for output, wherein said control signal is an internal clock signal;
a synchronized circuit that operates in synchronization with the output of said adjusting circuit;
a clock buffer circuit that receives an external clock signal from outside and outputs said internal clock signal;
a clock interconnection that transmits an output of said clock buffer circuit to said plurality of internal circuits; and
said synchronized circuit operates in synchronization with the output of the adjusting circuit;
wherein said adjusting circuit includes:
an input node that receives said control signal,
an output node that outputs a signal to said synchronized circuit, and
a plurality of passageways that pass from said input node to said output node; and
each of said passageways has an inverter and a first switch circuit that transmits an output of said inverter to said output node in accordance with a first set value,
wherein each of said passageways further has a second switch circuit that transmits a signal given to said input node as an input of said inverter in accordance with a second set value.

6. A semiconductor device comprising:

a clock buffer circuit that receives an external clock signal from outside and outputs an internal clock signal;

a clock interconnection that transmits an output of said clock buffer circuit; and a plurality of internal circuits that operate in accordance with said internal clock signal transmitted by said clock interconnection, each of said internal circuits including:

an adjusting circuit that outputs an adjusted internal clock by delaying said internal clock signal for a time period according to a delay time from said clock buffer circuit to a corresponding one of said plurality of internal circuits, and a synchronized circuit that operates in accordance with the output of said adjusting circuit, wherein said adjusting circuit comprises:

an input node that receives said internal clock signal, an output node that outputs a signal to said synchronized circuit, and a plurality of passageways that pass from said input node to said output node, each of said passageways has an interconnection that adjusts delay time, and a first switch circuit that connects one end of said interconnection to said output node in accordance with a first set value, wherein said first switch circuit includes a fuse element capable of setting, in a non-volatile manner, a conduction state that corresponds to said first set value.

7. A semiconductor device comprising a plurality of internal circuits that operate in accordance with a control signal, each of said internal circuits including an adjusting circuit that receives said control signal to adjust a delay time for output, wherein said control signal is an internal clock signal;

a synchronized circuit that operates in synchronization with the output of said adjusting circuit;

a clock buffer circuit that receives an external clock signal from outside and outputs said internal clock signal;

a clock interconnection that transmits an output of said clock buffer circuit to said plurality of internal circuits; and said synchronized circuit operates in synchronization with the output of the adjusting circuit;

wherein said adjusting circuit includes:

an input node that receives said control signal, an output node that outputs a signal to said synchronized circuit, and a plurality of passageways that pass from said input node to said output node; and each of said passageways has an interconnection that adjusts said delay time, and a first switch circuit that connects one end of said interconnection to said output node in accordance with a first set value, wherein said interconnections included in first and second passageways of said plurality of passageways are first and second interconnections, respectively, and said first and second interconnections each have a mutually different propagation delay time.

8. The semiconductor device according to claim 7, wherein said first and second interconnections each have a mutually different interconnection length.

9. The semiconductor device according to claim 7, wherein said first and second interconnections each have a mutually different interconnection width.

10. The semiconductor device according to claim 7, wherein a distance between a first part of said first interconnection and a first adjacent interconnection part disposed in parallel with said first part is different from a distance between a second part of said second interconnection and a second adjacent interconnection part disposed in parallel with said second part.

11. The semiconductor device according to claim 7, wherein said first and second interconnections are each formed of a mutually different interconnection layer.

12. A semiconductor device comprising a plurality of internal circuits that operate in accordance with a control signal, each of said internal circuits including an adjusting circuit that receives said control signal to adjust a delay time for output, wherein said control signal is an internal clock signal;

a synchronized circuit that operates in synchronization with the output of said adjusting circuit;

a clock buffer circuit that receives an external clock signal from outside and outputs said internal clock signal;

a clock interconnection that transmits an output of said clock buffer circuit to said plurality of internal circuits; and said synchronized circuit operates in synchronization with the output of the adjusting circuit;

wherein said adjusting circuit includes:

an input node that receives said control signal, an output node that outputs a signal to said synchronized circuit, and a plurality of passageways that pass from said input node to said output node; and each of said passageways has an interconnection that adjusts said delay time, and a first switch circuit that connects one end of said interconnection to said output node in accordance with a first set value, wherein each of said passageways further has a second switch circuit that transmits a signal, which is given to said input node, to the other end of said interconnection in accordance with a second set value.

* * * * *

UNITED STATES PATENT AND TRADEMARK OFFICE
CERTIFICATE OF CORRECTION

PATENT NO.    : 6,653,877 B2
DATED         : November 25, 2003
INVENTOR(S)   : Mitsunori Tsujino It is certified that error appears in the above-identified patent and that said Letters Patent is hereby corrected as shown below:

<u>Title page,</u>
Item [73], Assignee, change "Mitsubishi Denki Kabushiki Kaisha" to -- Renesas Technology Corp. --.

Signed and Sealed this

Tenth Day of February, 2004

JON W. DUDAS
*Acting Director of the United States Patent and Trademark Office*